(12) United States Patent
Lee et al.

(10) Patent No.: US 9,268,080 B2
(45) Date of Patent: Feb. 23, 2016

(54) DISPLAY DEVICE HAVING LIGHT CONVERSION MEMBER INCLUDING LIGHT CONVERSION PARTICLES

(75) Inventors: Kyu Tae Lee, Seoul (KR); In Jae Yeo, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 255 days.

(21) Appl. No.: 13/810,102

(22) PCT Filed: Jun. 20, 2011

(86) PCT No.: PCT/KR2011/004464
§ 371 (c)(1),
(2), (4) Date: Jan. 14, 2013

(87) PCT Pub. No.: WO2012/008692
PCT Pub. Date: Jan. 19, 2012

(65) Prior Publication Data
US 2013/0114299 A1    May 9, 2013

(30) Foreign Application Priority Data
Jul. 14, 2010    (KR) .................. 10-2010-0067987

(51) Int. Cl.
*F21V 8/00*    (2006.01)
*G02F 1/1335*    (2006.01)
*H01L 33/50*    (2010.01)

(52) U.S. Cl.
CPC ............ *G02B 6/0011* (2013.01); *G02B 6/0013* (2013.01); *G02B 6/0026* (2013.01); *G02F 1/133615* (2013.01); *H01L 33/507* (2013.01)

(58) Field of Classification Search
CPC ... G02B 6/0011; G02B 6/0013; G02B 6/0026
USPC .......... 362/97.1, 97.2, 609, 610, 612; 349/62, 349/63
See application file for complete search history.

(56) References Cited

U.S. PATENT DOCUMENTS

| 7,819,539 | B2 | 10/2010 | Kim et al. | |
|---|---|---|---|---|
| 2006/0072339 | A1 | 4/2006 | Li et al. | |
| 2006/0103589 | A1 | 5/2006 | Chua et al. | |
| 2007/0285943 | A1* | 12/2007 | Ouderkirk et al. | 362/609 |
| 2008/0084706 | A1 | 4/2008 | Roshan et al. | |
| 2009/0256167 | A1 | 10/2009 | Peeters et al. | |
| 2010/0103648 | A1* | 4/2010 | Kim et al. | 362/97.1 |
| 2011/0045259 | A1* | 2/2011 | Bockmeyer et al. | 428/212 |

FOREIGN PATENT DOCUMENTS

| JP | 2001-345007 A | 12/2001 |
|---|---|---|
| JP | 2003-322851 A | 11/2003 |
| JP | 2004-273185 A | 9/2004 |
| JP | 2006-108076 A | 4/2006 |

(Continued)

*Primary Examiner* — Karabi Guharay
(74) *Attorney, Agent, or Firm* — Birch, Stewart, Kolasch & Birch, LLP

(57) ABSTRACT

Provided is a display device. The display device includes a light guide plate, a light source disposed on a side surface of the light guide plate, a light conversion member disposed between the light source and the light guide plate, and a first adhesion member closely attached to the light guide plate and the light conversion member. An air layer between the light source and the light guide plate is removed by the first and second adhesion members to improve light incident efficient into the light guide plate.

15 Claims, 4 Drawing Sheets

(56) References Cited

FOREIGN PATENT DOCUMENTS

| | | |
|---|---|---|
| JP | 2007-67204 A | 3/2007 |
| JP | 2008-030459 A | 2/2008 |
| JP | 2008-112154 A | 5/2008 |
| JP | 2008-177106 A | 7/2008 |
| JP | 2009/38006 A | 2/2009 |
| JP | 2009-540558 A | 2/2009 |
| JP | 2009-110932 A | 5/2009 |
| KR | 10-2009-0021912 A | 3/2009 |
| KR | 10-2009-0091509 A | 8/2009 |
| KR | 10-2010-0046698 A | 5/2010 |

* cited by examiner

DISPLAY DEVICE HAVING LIGHT CONVERSION MEMBER INCLUDING LIGHT CONVERSION PARTICLES

TECHNICAL FIELD

Embodiments relate to a display device.

BACKGROUND ART

Light emitting diodes (LEDs) are semiconductor devices that convert electricity into ultraviolet rays, infrared rays, or visible light using characteristics of compound semi-conductors. The LEDs are being used for home appliances, remote controllers, large-scale screen, etc.

LED light sources having high brightness are being used for lighting lamps. In addition, since such an LED light source has high energy efficiency, low replacement cost due to a long life cycle, and durability against vibration or shock and does not use toxic substances such as mercury, existing incandescent lamps or fluorescent lamps are being replaced with LED light sources of energy-saving, environmental protection and reducing costs.

Also, LEDs are favorable for light sources of middle or large sized LCD televisions and monitors. The LEDs have superior color purity and low power consumption and allow easy miniaturization when compared to cold cathode fluorescent lamps (CCFLs) mainly used for light sources of the current liquid crystal displays (LCDs). Thus, the prototypes of these LEDs are being mass-produced, and also, researches with respect to the LEDs are being more actively conducted.

In recent, various technologies, which use a blue LED and realize white light using a quantum dot (QD) emitting red light and green light as a phosphor are being developed. This is done because the white light realized using the quantum dot has high brightness and superior color reproductivity.

Nevertheless, the need of researches for reducing light losses, which may occur in case where the LED is applied to LED backlight units, and improving color uniformity is on the rise as ever.

DISCLOSURE OF INVENTION

Technical Problem

Embodiments provide a display device having improved brightness, brightness uniformity, and high color reproductivity.

Solution to Problem

In one embodiment, a display device includes: a light guide plate; a light source disposed on a side surface of the light guide plate; a light conversion member disposed between the light source and the light guide plate; and a first adhesion member closely attached to the light guide plate and the light conversion member.

In another embodiment, a display device includes: a light guide plate; a light source disposed on a side surface of the light guide plate; a light conversion member disposed between the light source and the light guide plate; and dispersion particles changing a path of light emitted from the light source before or after passing through the light conversion member.

In further another embodiment, a display device includes: a light source emitting first light; a light conversion member converting a portion of the first light emitted from the light source into second and third light; a plurality of dispersion particles dispersing the first light; and a light guide plate into which the first, second, and third light are incident.

The details of one or more embodiments are set forth in the accompanying drawings and the description below. Other features will be apparent from the description and drawings, and from the claims.

Advantageous Effects of Invention

Also, in the display device according to the embodiments, the dispersion particles may be provided to realize the uniform light divergence angle as a whole. Specifically, the first light may have a divergence angle less than those of the second and third light.

Here, the dispersion particles may increase the divergence angle of the first light to allow the divergence angles of the first, second, and third light to be uniform as a whole.

Therefore, the first, second, and third light may be uniformly mixed with each other, and thus, the display device according to the embodiments may have the improved reproductivity. That is, the display device according to the embodiments may prevent the yellow phenomenon due to the low divergence angle of the first light from occurring.

MODE FOR THE INVENTION

Figure 1:
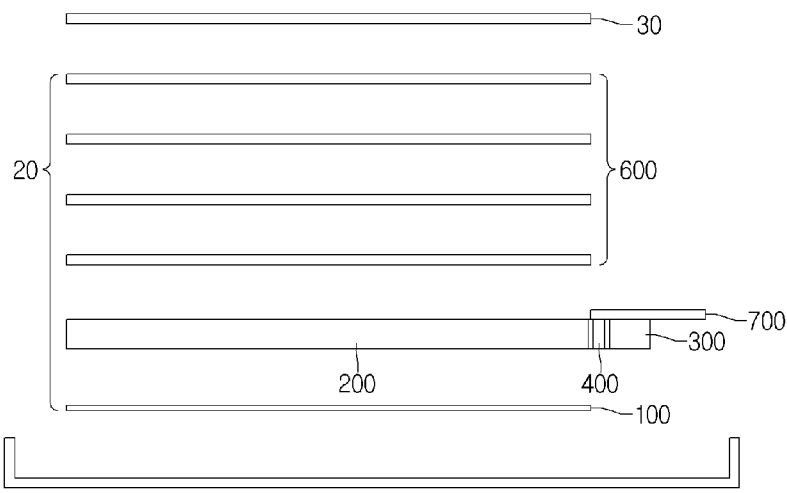
FIG. 1 is a view of a liquid crystal display according to a first embodiment.

In the descriptions of embodiments, it will be understood that when a substrate, a frame, a sheet, a layer, or a pattern is referred to as being 'on' a substrate, a substrate, a frame, a sheet, a layer, or a pattern, it can be directly on another layer or substrate, or intervening layers may also be present. Further, it will be understood that when a layer is referred to as being 'under' another layer, it can be directly under another layer, and one or more intervening layers may also be present. Further, the reference about 'on' and 'under' each layer will be made on the basis of drawings. In the drawings, the thickness or size of each layer is exaggerated, omitted, or schematically illustrated for convenience in description and clarity. Also, the size of each element does not entirely reflect an actual size.

Figure 2:
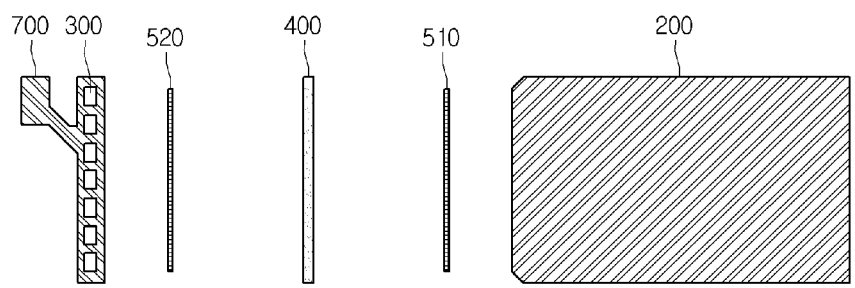
FIG. 2 is a view of a backlight assembly.
Figure 3:
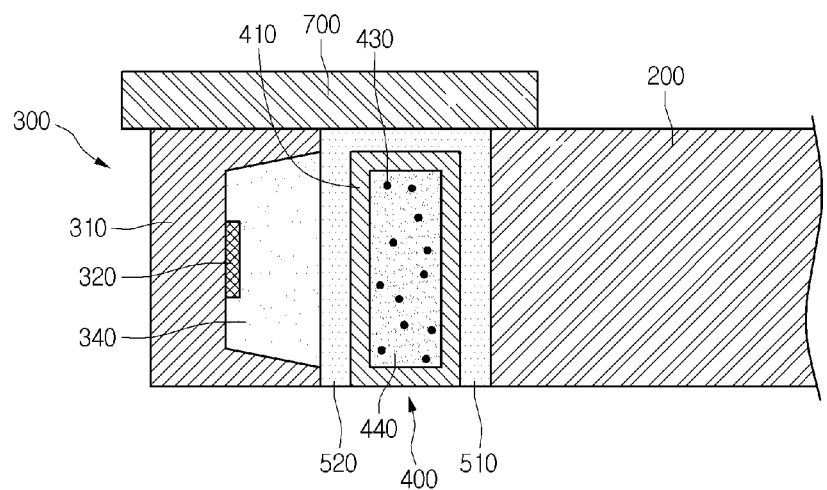
FIG. 3 is a sectional view illustrating one surface of the backlight assembly.
Figure 4:
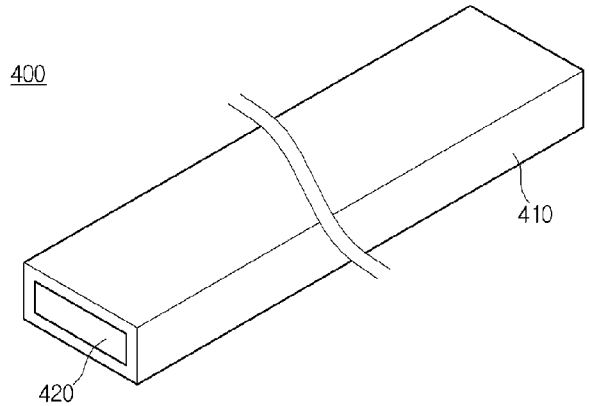
FIG. 4 is a view of a light conversion member.
Figure 5:
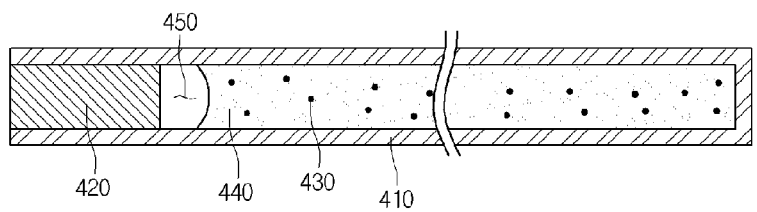
FIG. 5 is a sectional view illustrating one surface of the light conversion member.
Figure 6:
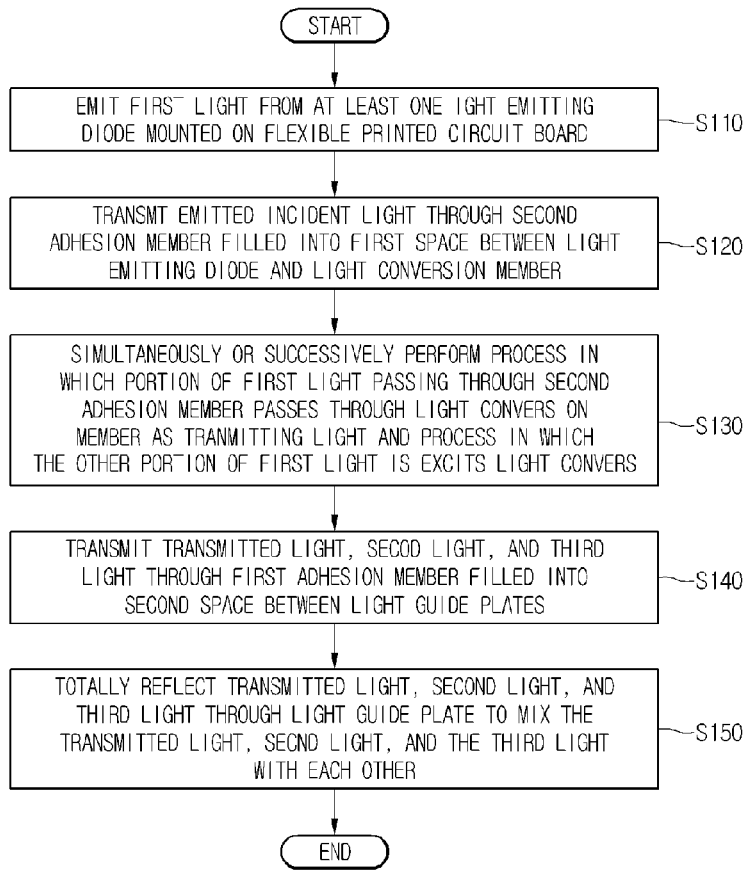
FIG. 6 is a view illustrating a process of display an image using the light crystal display according to the first embodiment.
Figure 7:
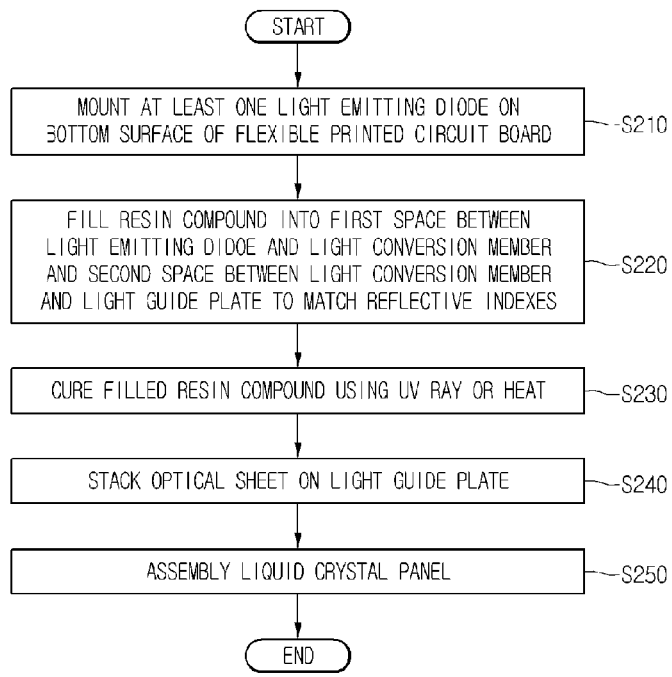
FIG. 7 is a view illustrating a process of manufacturing the light crystal display according to the first embodiment.

FIG. 1 is a view of a liquid crystal display according to a first embodiment. FIG. 2 is a view of a backlight assembly. FIG. 3 is a sectional view illustrating one surface of the backlight assembly. FIG. 4 is a view of a light conversion member. FIG. 5 is a sectional view illustrating one surface of the light conversion member. FIG. 6 is a view illustrating a process of display an image using the light crystal display according to the first embodiment. FIG. 7 is a view illustrating a process of manufacturing the light crystal display according to the first embodiment.

Referring to FIGS. 1 to 7, a liquid crystal display according to an embodiment includes a mold frame 10, a backlight assembly 20, and a liquid crystal panel 30.

The mold frame 10 receives the backlight assembly 20 and the liquid crystal panel 30. The mold frame 10 has a square frame shape. For example, the mold frame 10 may be formed of plastic or reinforcement plastic.

Also, a chassis surrounding the mold frame 10 and supporting the backlight assembly 20 may be disposed under the mold frame 10. The chassis may be disposed on a side surface of the mold frame 10.

The backlight assembly 20 is disposed inside the mold frame 10 to generate light, thereby emitting the generated light toward the liquid crystal panel 30. The backlight assembly 20 includes a reflective sheet 100, a light guide plate 200, a light emitting diode (LED) 300, a light conversion member 400, a first adhesion member 510, a second adhesion member 520, a plurality of optical sheets 600, and a flexible printed circuit board (FPCB) 700.

The reflective sheet 100 reflects light emitted from the LED 300 upward.

The light guide plate 200 is disposed on the reflective sheet 100. The light guide plate 200 receives the light emitted from the LED 300 to reflect the light upward through reflection, refraction, and dispersion.

The light guide plate 200 has a light incident surface facing the LED 300. That is, a surface facing the LED 300 of side surfaces of the light guide plate 200 is the light incident surface.

The LED 300 is disposed on a side surface of the light guide plate 200. In detail, the LED 300 is disposed on the light incident surface.

Referring to FIG. 3, the LED 300 may include a body part 310, an LED chip 320, a lead electrode (not shown), and a filler 340.

A cavity is defined in the body part 310. The cavity may receive the LED chip 320 and the filler 340. The body part 310 may be formed of plastic. A reflective layer (not shown) for reflecting light emitted from the LED chip 320 may be coated on an inner surface of the cavity.

The LED chip 320 is disposed inside the cavity. The LED chip 320 receives an electrical signal through the lead electrode to generate light. The LED chip 320 is electrically connected to the lead electrode.

The filler 340 surrounds the LED chip 320. The filler 340 may be filled into the inside of the cavity. The filler 340 is transparent. An exposed outer surface of the filler 340 is a light emission surface through which light is emitted. The light emission surface may be a flat or curved surface.

The lead electrode is connected to the LED chip 320. Also, the lead electrode is electrically connected to the FPCB 700. The lead electrode and the body part 310 may be manufactured through an injection molding process.

The LED 300 is a light source for generating light. In detail, the LED 300 emits light toward the light conversion member 400.

The LED 300 may be a blue LED generating blue light or an UV LED generating UV rays. That is, the LED 300 may generate the light having a wavelength band of about 430 nm to about 470 nm or an ultraviolet ray having wavelength band of about 300 nm to about 40 nm.

The LED 300 is mounted on the FPCB 700. The LED 300 is disposed under the FPCB 700. The LED 300 receives a driving signal through the FPCB 700, and then is driven.

The light conversion member 400 is disposed between the LED 300 and the light guide plate 200. The light conversion member 400 adheres to the side surface of the light guide plate 200. In detail, the light conversion member 400 is attached to the light incident surface of the light guide plate 200. Also, the light conversion member 400 may adhere to the LED 300.

The light conversion member 400 receives light emitted from the LED 300 to convert a wavelength of the light. For example, the light conversion member 400 may convert blue light emitted from the LED 300 into green light and red light. That is, the light conversion member 400 may convert a portion of the blue light into the green light having a wavelength band of about 520 nm to about 560 nm and the other portion of the blue light into the red light having a wavelength band of about 630 nm to about 660 nm.

Also, the light conversion member 400 may convert an ultraviolet ray emitted from the LED 300 into blue, green, and red light. That is, the light conversion member 400 may convert a portion of the ultraviolet ray into blue light having a wavelength band of about 430 nm to about 470 nm, another portion of the ultraviolet ray into green light having a wavelength band of about 500 nm to about 600 nm, and further another portion of the ultraviolet ray into red light having a wavelength band of about 630 nm to about 660 nm.

Thus, the light transmitting the light conversion member 400 and the light converted by the light conversion member 400 may generate white light. That is, the blue light, the green light, and the red light may be combined with each other to generate the white light, and then, the generated white light may be incident into the light guide plate 200.

Referring to FIGS. 3 to 5, the light conversion member 400 includes a tube 410, a sealing member 420, a plurality of light conversion particles 430, and a host 440. Also, the light conversion member 400 may further include a disperser.

The tube 410 receives the sealing member 420, the light conversion particles 430, and the host 440. That is, the tube 410 may be a container for receiving the sealing member 420, the light conversion particles 430, and the host 440. Also, the tube 410 has a shape longitudinally extending in one direction.

The tube 410 may have a square tube shape. That is, the tube 410 may have a rectangular shape in a section of a direction perpendicular to a length direction thereof. Also, the tube 410 may have a height of about 0.6 mm and a thickness of about 0.2 mm. That is, the tube 410 may be a capillary tube.

The tube 410 is transparent. For example, the tube 410 may be formed of glass. That is, the tube 410 may be a glass capillary tube.

The sealing member 420 is disposed inside the tube 410. The sealing member 420 is disposed on an end of the tube 410. The sealing member 420 seals the inside of the tube 410. The sealing member 420 may be formed of an epoxy resin.

The light conversion particles 430 are disposed inside the tube 410. In detail, the light conversion particles 430 are uniformly dispersed in the host 440, and the host 440 is disposed inside the tube 410.

The light conversion particles 430 convert a wavelength of light emitted from the LED 300. The light conversion particles 430 receive the light emitted from the LED 300 to convert the wavelength of the light. For example, the light conversion particles 430 may convert the blue light emitted from the LED 300 into green light and red light. That is, a portion of the light conversion particles 430 may convert the blue light into the green light having a wavelength band of about 520 nm to about 560 nm, and the other portion of the light conversion particles 430 may convert the blue light into the red light having a wavelength band of about 630 nm to about 660 nm.

On the other hand, the light conversion particles 430 may convert an ultraviolet ray emitted from the LED 300 into blue, green, and red light. That is, a portion of the light conversion particles 430 may convert the ultraviolet ray into blue light having a wavelength band of about 430 nm to about 470 nm, another portion of the light conversion particles 430 may convert the ultraviolet ray into green light having a wavelength band of about 520 nm to about 560 nm, and further another portion of the light conversion particles 430 may convert the ultraviolet ray into red light having a wavelength band of about 630 nm to about 660 nm.

That is, when the LED 300 is the blue LED emitting the blue light, the light conversion particles 430 for respectively converting the blue light into the green and red light may be used. On the other hand, when the LED 300 is the UV LED emitting the ultraviolet ray, the light conversion particles 430 for respectively converting the ultraviolet ray into the blue, green, and red light may be used.

The light conversion particles 430 may be a plurality of quantum dots QD. Each of the quantum dots may include a core nano crystal and a shell nano crystal surrounding the core nano crystal. Also, the quantum dot may include an organic ligand coupled to the shell nano crystal. Also, the quantum dot may include an organic coated layer surrounding to the shell nano crystal.

The shell nano crystal may have two-layered structure. The shell nano crystal is disposed on a surface of the core nano crystal. The quantum dot may convert a wavelength of light incident into the core nano crystal into light having a long wavelength through the shell nano crystal forming a shell layer to improve light efficiency.

The quantum dot may be formed of at least one material of a group II compound semiconductor, a group III compound semiconductor, a group V compound semi-conductor, and a group VI compound semiconductor. In detail, the core nano crystal may be formed of Cdse, InGaP, CdTe, CdS, ZnSe, ZnTe, ZnS, HgTe, or HgS. Also, the shell nano crystal may be formed of CuZnS, CdSe, CdTe, CdS, ZnSe, ZnTe, ZnS, HgTe, or HgS. Each of the quantum dots may have a diameter of about 1 nm to about 10 nm.

The wavelength of the light emitted from the quantum dots may be adjusted according to a size of each of the quantum dots or a molar ratio of a molecular cluster compound and a nano particle precursor in a synthesis process. The organic ligand may be formed of at least one of pyridine, mercapto alcohol, thiol, phosphine, and phosphine oxide. The organic ligand may stabilize the unstable quantum dots after the synthesis process is performed. After the synthesis process is performed, a dangling bond is formed outside the quantum dots. Thus, the quantum dots may be instable due to the dangling bond. However, one end of the organic ligand may be in a non-bonded state, and the non-bonded one end of the organic ligand may be bonded to the dangling bond to stabilize the quantum dots.

Specifically, when the quantum dot has a radius less than a Bohr radius of an exciton constituted by an electron and hole, which are excited by light and electricity, a quantum confinement effect may occur. Thus, the quantum dot has a discrete energy level to change an intensity of an energy gap. In addition, a charge may be limited within the quantum dot to provide high light emitting efficiency.

The quantum dot may be changed in emission wavelength according to a particle size thereof, unlike a general fluorescent dye. That is, when the particle size is gradually decreased, the quantum dot may emit light having a short wavelength. Thus, the particle size may be adjusted to emit visible light having a desired wavelength. Also, since the quantum dot has an extinction coefficient greater by about 100 times to about 1,000 times than that of the general fluorescent dye and quantum yield greater than that of the general fluorescent dye, the quantum dot may emit very intense light.

The quantum dot may be synthesized by a chemical wet etching process. Here, the chemical wet etching process is a process in which a precursor material is immersed into an organic solvent to grow particles. Thus, the quantum dot may be synthesized through the chemical wet etching process.

The host 440 surrounds the light conversion particles 430. That is, the light conversion particles 430 are uniformly dispersed into the host 440. The host 440 may be formed of a polymer. The host 440 is transparent. That is, the host 440 may be formed of a transparent polymer.

The host 440 is disposed inside the tube 410. That is, the host 440 is filled into the tube 410 as a whole. The host 440 may be closely attached to an inner surface of the tube 410.

An air layer 450 may be disposed between the sealing member 420 and the host 440. The air layer 450 is filled with nitrogen. The air layer 450 may serve as a buffer layer between the sealing member 420 and the host 440.

As shown in FIGS. 2 and 3, the first adhesion member 510 is disposed between the light guide plate 200 and the light conversion member 400. The first adhesion member 510 is closely attached to the light guide plate 200 and the light conversion member 400. In detail, the first adhesion member 510 is closely attached to the light incident surface of the light guide plate 200 and closely attached to an outer surface of the tube 410.

That is, the first adhesion member 510 may be attached or adhere to the light incident surface of the light guide plate 200 so that the air layer is not disposed between the first adhesion member 510 and the light incident surface of the light guide plate 200. Similarly, the first adhesion member 510 may be attached or adhere to the outer surface of the tube 410 so that the air layer is not disposed between the first adhesion member 510 and the outer surface of the tube 410. That is, the first adhesion member 510 may be a gap filler filling a gap between the light conversion member 400 and the light guide plate 200.

The first adhesion member 510 is transparent. The first adhesion member 510 may be formed of a transparent resin. Also, the first adhesion member 510 may be formed of a thermosetting resin or a thermoplastic resin. Also, the first adhesion member 510 may be formed of an epoxy-based resin.

The first adhesion member 510 may have a reflective index within about ±0.1 with respect to that of the light guide plate 200. That is, the first adhesion member 510 may have a reflective index satisfying the following Equation 1.

$$n3-0.1<n1<n3+0.1 \qquad \text{[Equation 1]}$$

Where, n1 denotes a reflective index of the first adhesion member 510, and n3 denotes a reflective index of the light guide plate 200.

For example, the first adhesion member 510 may have a reflective index of about 1.47 to about 1.67.

The first adhesion member 510 may serve as an optical buffer function between the light conversion member 400 and the light guide plate 200. That is, the first adhesion member 510 may prevent the air layer from being disposed between the light conversion member 400 and the light guide plate 200 and have a reflective index similar to those of the tube 410 and the light guide plate 200. As a result, the first adhesion member 510 may reduce a significant change of the reflective index between the light conversion member 400 and the light guide plate 200.

As shown in FIGS. 2 and 3, the second adhesion member 520 is disposed between the LED 300 and the light conversion member 400. The second adhesion member 520 is closely attached to the LED 300 and the light conversion member 400. In detail, the second adhesion member 520 is closely attached to the light emission surface of the LED 300 and closely attached to an outer surface of the tube 410.

That is, the second adhesion member 520 may be attached or adhere to the light emission surface of the LED 300 so that the air layer is not disposed between the second adhesion member 520 and the light emission surface of the LED 300. Similarly, the second adhesion member 520 may be attached or adhere to the outer surface of the tube 410 so that the air layer is not disposed between the second member 520 and the outer surface of the tube 410. That is, the second adhesion member 520 may be a gap filler filling a gap between the LED 300 and the light conversion member 400.

The second adhesion member 520 is transparent. The second adhesion member 520 may be formed of a transparent resin. Also, the second adhesion member 520 may be formed of a thermosetting resin or a photocurable resin. Also, the second adhesion member 520 may be formed of an epoxy-based resin.

The second adhesion member 520 may have a reflective index within about ±0.1 with respect to that of the filler 340 of the LED 300. That is, the second adhesion member 510 may have a reflective index satisfying the following Equation 2.

$$n4-0.1 < n2 < n4+0.1 \quad \text{[Equation 2]}$$

Where, n2 denotes a reflective index of the second adhesion member 520, and n4 denotes a reflective index of the filler 340.

For example, the second adhesion member 520 may have a reflective index of about 1.44 to about 1.64.

The second adhesion member 520 may serve as an optical buffer function between the light conversion member 400 and the LED 300. That is, the second adhesion member 520 may prevent the air layer from being disposed between the light conversion member 400 and the LED 300 and have a reflective index similar to those of the tube 410 and the filler 340. As a result, the second adhesion member 520 may reduce a significant change of the reflective index between the light conversion member 400 and the filler 340.

Also, the first and second adhesion members 510 and 520 may be formed of the same material as each other.

The optical sheets 600 are disposed on the light guide plate 200. The optical sheets 600 improve characteristics of light transmitting therethrough.

The FPCB 700 is electrically connected to the LED 300. The LED 300 may be mounted on the FPCB 700. The FPCB 700 may be a flexible printed circuit board and disposed within the mold frame 10. The FPCB 700 is disposed on the light guide plate 200.

A backlight unit is constituted by the mold frame 10 and the backlight assembly 20. That is, the backlight unit includes the mold frame 10 and the backlight assembly 20.

The liquid crystal panel 30 is disposed inside the mold frame 10 and on the optical sheets 600.

The liquid crystal panel 30 adjusts an intensity of light transmitting therethrough to display an image. That is, the liquid crystal panel 30 is a display panel for display an image. The liquid crystal panel 30 includes a TFT substrate, a color filter substrate, a liquid crystal layer disposed between the two substrates, and polarizing filters.

Referring to FIG. 6, the liquid crystal display according to an embodiment may display an image through the following processes.

First light is emitted from the LED 300. Here, blue light may be emitted from the LED 300 (S110).

The emitted first light passes through the second adhesion member 520 (S120). Here, since the air layer between the LED 300 and the light conversion member 400 is removed by the second adhesion member 520, light losses (e.g., Fresnel losses) due to a significant reflective index difference may be prevented. Thus, the brightness of the light crystal display according to an embodiment may be improved by the second adhesion member 520.

A portion of the first light passing through the second adhesion member 520 passes through the light conversion member 400, the other portion of the first light is converted into second and third light by the light conversion particles 430. That is, a portion of the first light passes through the light conversion member 400, and the second and third light are emitted from the light conversion member 400 (S130). Here, the first light may be blue light, the second light may be green light, and the third light may be red light.

The transmitted first, second, and third light pass through the first adhesion member 510 (S140). Similarly, since the air layer between the light guide plate 200 and the light conversion member 400 is removed by the first adhesion member 510, light losses due to a significant reflective index difference may be prevented. Thus, the brightness of the light crystal display according to an embodiment may be improved by the first adhesion member 510.

Next, the first, second, and third light are totally reflected through the light guide plate 200 and mixed with each other. Then, the mixed light is emitted through a top surface of the light guide plate (S150).

Thereafter, the mixed light passes through the optical sheets 600 and is incident into the light crystal panel 30. The liquid crystal panel 30 displays an image using the incident light.

Figure 8:
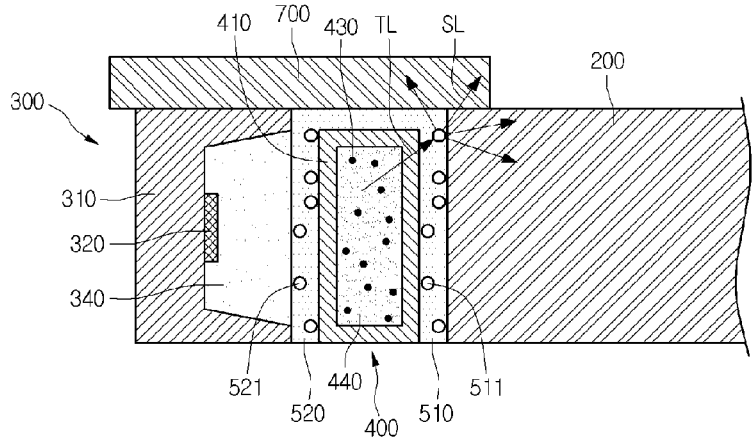
FIG. 8 is a sectional view illustrating one surface of a liquid crystal display according to a second embodiment.

Also, as shown in FIG. 8, the liquid crystal display according to an embodiment will be manufactured through following processes.

The LED 300 is mounted on a bottom surface of the FPCB 700 (S210).

The photocurable and/or thermosetting first resin compound(s) is/are filled between the LED 300 and the light conversion member 400. Also, the resin compound is filled between the light guide plate 200 and the light conversion member 400 (S220).

The filled resin compound is cured by a UV ray and/or heat to form the first and second adhesion members 510 and 520 (S230).

The optical sheets 600 are stacked on the light guide plate 200 (S240). Then, the liquid crystal panel 30 may be assembled (S250) to manufacture the liquid crystal display according to the embodiment.

As described above, optical losses between the light guide plate 200 and the light conversion member 400 and between the LED 300 and the light conversion member 400 may be reduced.

Thus, the liquid crystal display according to the embodiment may have improved brightness.

Figure 9:
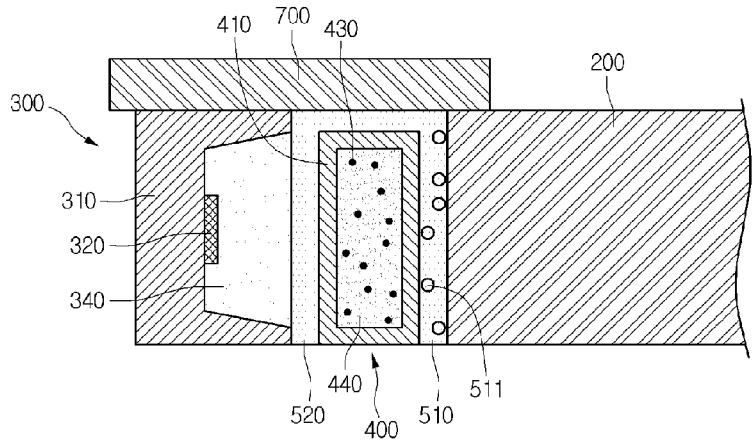
FIG. 9 is a sectional view illustrating one surface of a liquid crystal display according to a third embodiment.
Figure 10:
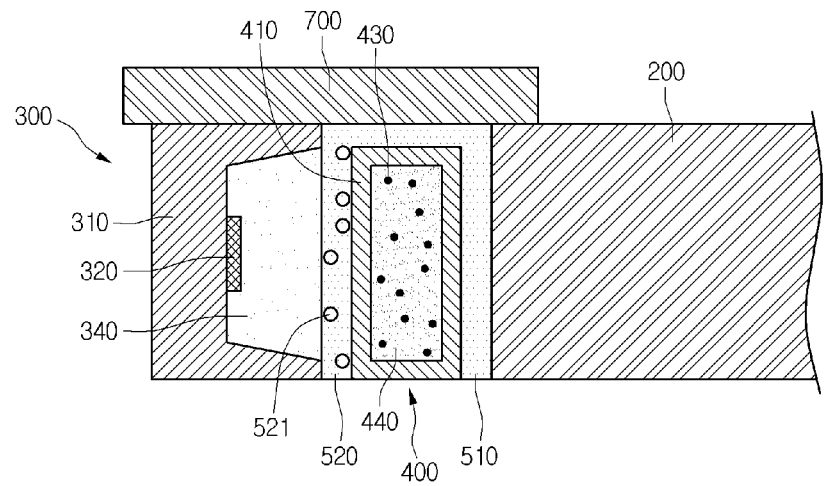
FIG. 10 is a sectional view illustrating one surface of a liquid crystal display according to a fourth embodiment.

FIG. 8 is a sectional view illustrating one surface of a liquid crystal display according to a second embodiment. FIG. 9 is a sectional view illustrating one surface of a liquid crystal display according to a third embodiment. FIG. 10 is a sectional view illustrating one surface of a liquid crystal display according to a fourth embodiment. The current embodiments will be described with reference to the foregoing embodiment, and first and second dispersion particles will be additionally described. That is, the description with respect to the foregoing embodiment may be fundamentally coupled to the description of the current embodiment except modified portions thereof.

Referring to FIG. 8, a liquid crystal display according to the current embodiment includes a plurality of first dispersion particles 511 and a plurality of second dispersion particles 521.

The first dispersion particles 511 are disposed between a light conversion member 400 and a light guide plate 200. The first dispersion particles 511 are disposed within a first adhesion member 510. The first dispersion particles 511 are inserted into the first adhesion member 510. That is, the first dispersion particles 511 are uniformly dispersed into the first adhesion member 510. The first dispersion particles 511 may be dispersed into the first adhesion member 510 at a ratio of about 0.00001 wt % to about 10 wt %.

The first dispersion particles 511 may disperse incident light. In detail, the first dispersion particles may be emitted from the LED 300 to disperse first light passing through the light conversion member 400.

Also, the first dispersion particles 511 may disperse second and third light converted by the light conversion member 400.

The first dispersion particles 511 may be transparent. For example, each of the first dispersion particles 511 may be formed of titanium oxide (e.g., TiO2). In detail, each of the first dispersion particles 511 may be formed of anatase titanium dioxide. Each of the first dispersion particles 511 may have a diameter of about 100 nm to about 400 nm.

The second dispersion particles 521 are disposed between the light conversion member 400 and the LED 300. The first dispersion particles 521 are disposed within a second adhesion member 520. The first dispersion particles 521 are inserted into the second adhesion member 520. That is, the second dispersion particles 521 are uniformly dispersed into the second adhesion member 520. The second dispersion particles 521 may be dispersed into the second adhesion member 520 at a ratio of about 0.00001 wt % to about 10 wt %.

The second dispersion particles 521 may disperse incident light. In detail, the second dispersion particles 521 may disperse the first light emitted from the LED 300. Thus, the first light emitted from the LED 300 is dispersed and incident into the light conversion member 400. Also, a portion of the first light may pass through the light conversion member 400 in a state where it is dispersed by the second dispersion particles 521.

The second dispersion particles 521 may have the substantially same characteristic as the first dispersion particles 511. That is, the second dispersion particles 521 may be transparent. For example, each of the second dispersion particles 521 may be formed of titanium oxide (e.g., TiO2). In detail, each of the second dispersion particles 521 may be formed of anatase titanium dioxide. Each of the second dispersion particles 521 may have a diameter of about 100 nm to about 400 nm.

Referring to FIG. 9, only the first dispersion particles may be dispersed into the first adhesion member 510, and the second dispersion particles 521 may be omitted.

Also, referring to FIG. 10, only the second dispersion particles 521 may be dispersed into the second adhesion member 520, and the first dispersion particles 511 may be omitted.

The first light emitted from the LED 300 may have a divergence angle less than those of the second and third light converted by the light conversion member 400. That is, the first light has an orientation angle less than those of the second and third light when it is emitted from the LED 300.

When the first light is converted into the second and third light by the light dispersion particles of the light conversion member 400, the second and third light may be randomly emitted in all directions. Thus, the second and third light may have relatively large divergence angels, respectively.

Here, the first light emitted from the LED 300 may be dispersed by the first and second dispersion particles 511 and 521. That is, the first light may be incident into the light guide plate 200 with a large divergence angle.

That is, the first light emitted from the LED 300 may be dispersed by the second dispersion particles 521 and incident into the light conversion member 400 with a large divergence angle. Also, the first light TL passing through the light conversion member 400 may be dispersed by the first dispersion particles 511, and thus, the first light SL having a more wide orientation angle may be incident into the light guide plate 200.

Thus, the first, second, and third light may have the substantially same divergence angle as each other. Thus, the first, second, and third light may be uniformly mixed with each other and incident into the light guide plate 200.

Thus, the liquid crystal display according to an embodiment may have improved color reproductivity.

Figure 11:
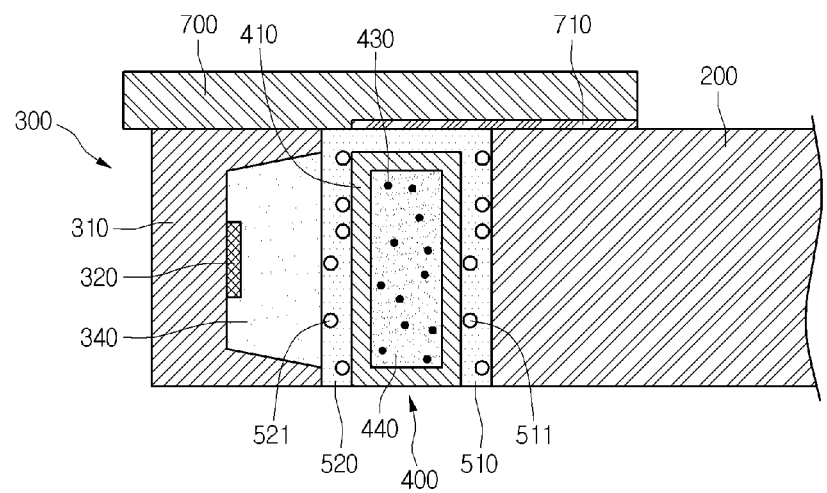
FIG. 11 is a sectional view illustrating one surface of a liquid crystal display according to a fifth embodiment.
Figure 12:
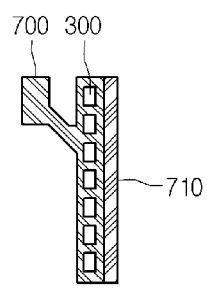
FIG. 12 is a view of a flexible printed circuit board and a light emitting diode according to the fifth embodiment.

FIG. 11 is a sectional view illustrating one surface of a liquid crystal display according to a fifth embodiment. FIG. 12 is a view of a flexible printed circuit board and a light emitting diode according to the fifth embodiment. The current embodiments will be described with reference to the foregoing embodiment, and first and second dispersion particles will be additionally described. That is, the description with respect to the foregoing embodiment may be fundamentally coupled to the description of the current embodiment except modified portions thereof.

Referring to FIGS. 11 and 12, the liquid crystal display according to the current embodiment includes a reflection part 710. The reflection part 710 may be disposed on a FPCB 700. The reflection part 710 may be disposed on the light conversion member and the light guide plate 200.

The reflection part 710 may cover the light conversion member 400. Also, the reflection part 710 may cover a portion of a top surface of the light guide plate 200.

The reflection part 710 may be disposed between the FPCB and the light guide plate 200. Alternatively, the reflection part 710 may be formed as a portion of the FPCB 500. Alternatively, the reflection part 710 may be coated on a bottom surface of the FPCB 700.

The reflection part 710 may reflect first light emitted from the LED 300. In detail, the reflection part 710 may selectively reflect the first light. That is, the reflection part 710 may have a high reflectance with respect to the first light and a low reflectance with respect to second and third light.

For example, the reflection part 710 may have a high reflectance with respect to blue light and a low reflectance with respect to green and red light.

The reflection part 710 may be a blue-coated layer. The reflectance part 710 may contain a blue coloring matter such as a blue dye or blue pigment.

The reflection part 710 is disposed adjacent to a light incident surface of the light guide plate 200 to selectively reflect the first light, thereby uniformly mixing the first, second, and third light with each other.

Thus, the liquid crystal display according to the current embodiment may have the improved color reproducibility. Particularly, the liquid crystal display according to the current embodiment may effectively reduce a yellow phenomenon occurring in the light incident part of the light guide part 200.

Any reference in this specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

The embodiments may be used in display fields.

The invention claimed is:

1. A display device comprising:
a light guide plate;
a light source disposed on a side surface of the light guide plate;
a light conversion member including a container and light conversion particles received therein, the light conversion member disposed between the light source and the light guide plate;
a first adhesion member between the light guide plate and the light conversion member; and
a second adhesion member between the light source and the light conversion member,
wherein the first adhesion member makes direct contact with the ht guide plate and the light conversion member,
wherein the second adhesion member makes direct contact with the light source and the light conversion member,
wherein the light source comprises a filler,
wherein the first adhesion member has a reflective index within about ±0.1 with respect to a reflective index of the light guide plate, and
wherein the second adhesion member has a reflective index within about ±0.1 with respect to a reflective index of the filler.

2. The display device of claim 1, further comprising a plurality of dispersion particles disposed within the first adhesion member.

3. The display device of claim 1, further comprising:
a plurality of dispersion particles disposed within the second adhesion member.

4. The display device of claim 1, wherein the light source comprises:
a light emitting diode chip generating light, and
wherein the filler surrounds the light emitting diode chip.

5. The display device of claim 1, wherein the light conversion member further comprises:
a host surrounding the light conversion particles.

6. The display device of claim 5, wherein the first adhesion member and second adhesion member make direct contact with the container.

7. A display device comprising:
a light guide plate;
a light source disposed on a side surface of the light guide plate;
a light conversion member including a container and light conversion particles received therein, the light conversion member disposed between the light source and the light guide plate;
dispersion particles changing a path of light emitted from the light source before or after passing through the light conversion member; and
an adhesion member surrounding the dispersion particles,
wherein the adhesion member comprises:
a first adhesion member between the light guide plate and the light conversion member; and
a second adhesion member between the light source and the light conversion member,
wherein the first adhesion member makes direct contact with the light guide plate and the light conversion member,
wherein the second adhesion member makes direct contact with the light source and the light conversion member,
wherein the light source comprises a filler,
wherein the first adhesion member has a reflective index within about ±0.1 with respect to a reflective index of the light guide plate, and
wherein the second adhesion member has a reflective index within about ±0.1 with respect to a reflective index of the filler.

8. The display device of claim 7, wherein each of the dispersion particles is formed of titanium oxide.

9. The display device of claim 8, wherein the titanium oxide is anatase titanium dioxide.

10. The display device of claim 7, wherein each of the dispersion particles has a diameter of about 100 nm to about 400 nm.

11. The display device of claim 7, wherein the dispersion particles are dispersed into the adhesion member at a ratio of about 0.00001 wt % to about 10 wt %.

12. The display device of claim 7, wherein the light source emits blue light, and
wherein the light conversion member converts the blue light into green and red light.

13. A display device comprising:
a light source emitting first light;
a light conversion member including a container and light conversion particles received therein, the light conversion member converting a portion of the first light emitted from the light source into second and third light;
a plurality of dispersion particles dispersing the first light;
a light guide plate into which the first, second, and third light are incident; and
an adhesion member surrounding the dispersion particles,
wherein the adhesion member comprises:

a first adhesion member between the light guide plate and the light conversion member; and a second adhesion member between the light source and the light conversion member, wherein the first adhesion member makes direct contact with the light guide plate and the light conversion member, wherein the second adhesion member makes direct contact with the light source and the light conversion member, wherein the light source comprises a filler, wherein the first adhesion member has a reflective index within about ±0.1 with respect to a reflective index of the light guide plate, and wherein the second adhesion member has a reflective index within about ±0.1 with respect to a reflective index of the filler.

14. The display device of claim 13, further comprising a reflection part selectively reflecting the first light.

15. The display device of claim 13, wherein the dispersion particles are disposed between the light source and the light conversion member and between the light conversion member and the light guide plate.

* * * * *